(12) United States Patent
Onodera (10) Patent No.: US 8,130,514 B2
(45) Date of Patent: Mar. 6, 2012

(54) MOUNTING STRUCTURE, ELECTRO-OPTICAL DEVICE, AND ELECTRONIC APPARATUS

(75) Inventor: Hiroyuki Onodera, Matsumoto (JP)

(73) Assignee: Sony Corporation, Tokyo (JP)

( * ) Notice: Subject to any disclaimer, the term of this patent is extended or adjusted under 35 U.S.C. 154(b) by 431 days.

(21) Appl. No.: 12/400,076

(22) Filed: Mar. 9, 2009

(65) Prior Publication Data

US 2009/0237903 A1    Sep. 24, 2009

(30) Foreign Application Priority Data

Mar. 24, 2008  (JP) ................. 2008-075298
Feb. 9, 2009   (JP) ................. 2009-027453

(51) Int. Cl.
   *H05K 1/11* (2006.01)
(52) U.S. Cl. ........................... 361/803; 174/260
(58) Field of Classification Search .......... 361/780, 361/784, 789, 803; 174/260, 254, 257; 349/149–155; 257/730
   See application file for complete search history.

(56) References Cited

U.S. PATENT DOCUMENTS

| | | | | |
|---|---|---|---|---|
| 5,526,563 A * | 6/1996 | Tamaki et al. | ................. | 29/830 |
| 6,744,638 B2 * | 6/2004 | Terasaka | ................. | 361/803 |
| 6,774,969 B2 | 8/2004 | Ma et al. | | |
| 6,900,120 B2 | 5/2005 | Ma et al. | | |
| 6,992,745 B2 | 1/2006 | Kim et al. | | |
| 7,053,407 B2 | 5/2006 | Ma et al. | | |
| 7,148,427 B2 * | 12/2006 | Aruga et al. | ................. | 174/260 |
| 7,495,927 B2 * | 2/2009 | Furihata et al. | ................. | 361/760 |
| 2008/0231789 A1 * | 9/2008 | Kurasawa | ................. | 349/139 |

FOREIGN PATENT DOCUMENTS

| | | |
|---|---|---|
| JP | 11142871 A | 5/1999 |
| JP | 2001-332820 A | 11/2001 |
| JP | 2002-134851 | 5/2002 |
| JP | 2002134851 A | 5/2002 |
| JP | 2002-207437 | 7/2002 |
| JP | 2002207437 A | 7/2002 |
| JP | 2003131254 A | 5/2003 |

OTHER PUBLICATIONS

Japanese Office Action for JP2009-027453 issued on Jul. 20, 2010.

* cited by examiner

*Primary Examiner* — Yuriy Semenenko
(74) *Attorney, Agent, or Firm* — K&L Gates LLP (57) ABSTRACT

A mounting structure includes: a first substrate; a second substrate; a first terminal being formed on the first substrate and having a plurality of terminal portions arranged with a gap therebetween; a different terminal being formed on the first substrate and being adjacent to the first terminal; and a second terminal being formed on the second substrate and being electrically connected to at least one of the terminal portions of the first terminal. Here, the first terminal is supplied with a potential higher than that supplied to the different terminal.

5 Claims, 9 Drawing Sheets

MOUNTING STRUCTURE, ELECTRO-OPTICAL DEVICE, AND ELECTRONIC APPARATUS

RELATED APPLICATIONS

The present application is based on, and claims priority from, Japanese Application Number 2008-075298, filed Mar. 24, 2008, and Japanese Application Number 2009-027453, filed Feb. 9, 2009, the disclosures of which are hereby incorporated by reference herein in their entirety.

BACKGROUND

1. Technical Field

The present invention relates to a terminal structure of a mounting structure suitably applicable to an electro-optical device.

2. Related Art

In the past, various electro-optical devices such as a liquid crystal display, an organic electroluminescence display, a plasma display, and a field emission display were known.

The liquid crystal display as an example of the electro-optical devices includes a liquid crystal display panel in which a liquid crystal layer is interposed between a pair of substrates and a flexible printed circuit (FPC) connected to the liquid crystal display panel. The liquid crystal display includes a mounting structure electrically connecting one substrate of the liquid crystal display panel and the FPC through terminals. The terminals in the mounting structure are supplied with predetermined potentials of signals through various lines. However, when a great potential difference exists between the adjacent terminals, the terminal having the higher potential may be corroded and broken due to an electrochemical reaction resulting from impurity ions included in the mounting structure, moisture permeated from the outside or the like, and an electric field. Therefore, in order to prevent the corrosion or break of the terminals or lines in the mounting structure, it is effective to exclude elements causing the electrochemical reaction as much as possible.

However, since the liquid crystal display including the mounting structure can be used under a high-temperature and high-humidity environment, it is difficult to completely remove the moisture from the mounting structure. Since the impurity ions are inherently included in the material of the mounting structure, it is also difficult to completely remove the impurity ions from the mounting structure. Therefore, by increasing a distance between the adjacent terminals having a great potential difference as greatly as possible in the mounting structure, it is possible to prevent the terminal of the two terminals having the higher potential from being corroded and broken due to the electrochemical reaction.

Regarding this technique, a flexible circuit board with high reliability in which signal supply lines are not corroded and broken due to the electrochemical reaction is described in JP-A-2001-332820. In the flexible circuit board, a linear dummy electrode not supplying a signal is formed between a power supply line and a reference potential line having a great potential difference of supply signals among the neighboring signal supply lines. Accordingly, since a strong electric field is not generated directly between the power supply line and the reference potential line, it is considered that the power supply line and the reference potential line should not be corroded and broken due to the electrochemical reaction with the impurities remaining in the flexible circuit board.

From the above-mentioned point of view, a circuit board capable of preventing lines from being corroded and broken due to electrical corrosion even when a difference exists in voltages applied to the adjacent lines is described in JP-A-11-142871. In the circuit board, plural lines are arranged in parallel on a substrate in an order of increasing potentials (decreasing potentials) applied thereto. Accordingly, since the potential difference between the adjacent lines is relatively small, it is considered that the line having the higher potential should hardly be corroded and broken due to the electrical corrosion. In the circuit board, since the potential difference between a ground voltage line and a gate-off level line is relatively great, the ground voltage line of both lines having the higher potential may be subjected to the electrical corrosion. Therefore, in the circuit board, by disposing a dummy line between both lines and supplying the higher potential of both lines to the dummy line, both lines are prevented from the electrical corrosion.

As described above, in order to prevent the terminals or lines from being corroded and broken due to the electrochemical reaction in the mounting structure, it is effective to increase the distance between the adjacent terminals when the potential difference between the adjacent terminals is great. However, even when the distance between the adjacent terminals having a great potential difference is increased, the terminal having the higher potential (particularly, terminal having a higher plus potential) is actually corroded and broken. Therefore, by using only these methods, it is not possible to completely prevent the corrosion and break of the terminals or lines due to the electrochemical reaction.

In JP-A-2001-332820 and JP-A-11-142871, in order to prevent the corrosion and break of the terminal having the higher potential between the adjacent lines, it is necessary to provide an independent dummy electrode to the flexible circuit board or the circuit board. Accordingly, in relations to other electronic components (for example, a driver IC), the layout of lines is complicated or the cost of product is increased.

SUMMARY

An advantage of some aspects of the invention is that it provides a mounting structure capable of preventing a terminal from corrosion and break without complicating a line layout and without causing an increase in product cost, an electro-optical device employing the mounting structure, and an electronic apparatus employing the mounting structure.

According to an aspect of the invention, there is provided a mounting structure including: a first substrate; a second substrate; a first terminal being formed on the first substrate and having a plurality of terminal portions arranged with a gap therebetween; a different terminal being formed on the first substrate and being adjacent to the first terminal; and a second terminal being formed on the second substrate and being electrically connected to at least one of the terminal portions of the first terminal. Here, the first terminal is supplied with a potential higher than that supplied to the different terminal.

For example, the mounting structure is used under a high-temperature and high-humidity environment and the first terminal is supplied with a potential higher than that of the adjacent different terminal. In this case, a potential difference exists between the potentials supplied to the first terminal and the different terminal adjacent thereto. Among the terminal portions of the first terminal supplied with the potential higher than that of the different terminal, the terminal portion adjacent to the different terminal may be corroded and broken due to the electrochemical reaction generated by an interaction between the moisture, the impurity ions, and the electric field.

However, since the equivalent potential is supplied to the plural terminal portions of the first terminal, the terminal portion not disposed adjacent to the different terminal among the terminal portions of the first terminal has a potential difference of about 0 V from the terminal portions disposed adjacent to the different terminal. As a result, the electrochemical reaction hardly occurs and the terminal portions disposed adjacent to the different terminal serve as a barrier, whereby it is possible to prevent the terminal portion not disposed adjacent to the different terminal from corrosion and break.

As a result, it is possible to improve the reliability in electrical connection between the first terminal and the second terminal. According to this configuration, the layout of lines is not complicated and the increase in cost due to the layout of lines is not caused, compared with the configurations described in JP-A-2001-332820 and JP-A-11-142871.

In the mounting structure, it is preferable that the second terminal of the second substrate has a plurality of terminal portions arranged with a gap therebetween and the terminal portions of the second terminal are electrically connected to the terminal portions of the first terminal.

In the mounting structure, it is preferable that the terminal portion of the first terminals not disposed adjacent to the different terminal includes a metal film and a corrosion-resistance conductive film disposed at a position covering the metal film.

According to the above-mentioned mounting structure, since the terminal portion not disposed adjacent to the different terminal among the terminal portions of the first terminal is covered with the corrosion-resistance conductive film, it is possible to further prevent the terminal portion not disposed adjacent to the different terminal from corrosion and break.

In the mounting structure, it is preferable that the terminal portions of the first terminal include at least three terminal portions, the second terminal includes at least three terminal portions arranged with a gap therebetween, and the at least three terminal portions of the first terminal are electrically connected to the at least three terminal portions of the second terminal.

For example, the mounting structure is used under a high-temperature and high-humidity environment and the first terminal is supplied with a potential higher than that of the adjacent different terminal. In this case, a potential difference exists between the potentials supplied to the first terminal and the different terminal adjacent thereto. Among the at least three terminal portions of the first terminal supplied with the potential higher than that of the different terminal, the outermost terminal portion adjacent to the different terminal may be corroded and broken due to the electrochemical reaction generated by an interaction between the moisture, the impurity ions, and the electric field.

However, since the equivalent potential is supplied to the at least three terminal portions of the first terminal, at least one inner terminal portion among the at least three terminal portions of the first terminal has a potential difference of about 0 V from the outermost terminal portion adjacent to the different terminal. As a result, the electrochemical reaction hardly occurs and the outermost terminal portion adjacent to the different terminal serve as a barrier, whereby it is possible to prevent the at least one inner terminal portion from corrosion and break.

As a result, it is possible to improve the reliability in electrical connection between the first terminal and the second terminal. According to this configuration, the layout of lines is not complicated and the increase in cost due to the layout of lines is not caused, compared with the configurations described in JP-A-2001-332820 and JP-A-11-142871.

In the mounting structure, it is preferable that the different terminal is formed on only one side of the first terminal on the first substrate.

According to another aspect of the invention, there is provided a mounting structure including: a first substrate; a second substrate; a first terminal being formed on the first substrate and having a metal film and a corrosion-resistance conductive film disposed at a position covering the metal film; a corrosion-resistance island-shaped conductive film being formed on the first substrate and being disposed adjacent to the first terminal; a different terminal being formed on the first substrate and being disposed adjacent to the opposite side of the first terminal about the island-shaped conductive film; a second terminal being formed on the second substrate; and a plurality of terminal portions being formed in the second terminal, being electrically connected to the conductive film of the first terminal and the island-shaped conductive film, and being arranged with a gap therebetween. Here, the conductive film of the first terminal and the island-shaped conductive film are supplied with a potential higher than that supplied to the different terminal.

For example, the mounting structure is used under a high-temperature and high-humidity environment and the first terminal and the corrosion-resistance island-shaped conductive film are supplied with a potential higher than that of the different terminal adjacent to the opposite side of the first terminal about the corrosion-resistance island-shaped conductive film. In this case, a potential difference exists between the potentials supplied to the first terminal, the corrosion-resistance island-shaped conductive film, and the different terminal adjacent to the opposite side of the first terminal about the corrosion-resistance island-shaped conductive film. Among the first terminal and the corrosion-resistance island-shaped conductive film supplied with the potential higher than that of the different terminal, the corrosion-resistance island-shaped conductive film disposed adjacent to the different terminal may be corroded and broken due to the electrochemical reaction generated by an interaction between the moisture, the impurity ions, and the electric field.

However, since the equivalent potential is supplied to the first terminal and the corrosion-resistance island-shaped conductive film adjacent to the first terminal, the first terminal has a potential difference of about 0 V from the corrosion-resistance island-shaped conductive film adjacent to the first terminal. As a result, the electrochemical reaction hardly occurs and the conductive film of the first terminal and the corrosion-resistance island-shaped conductive film adjacent to the first terminal serve as a barrier, whereby it is possible to prevent the metal film of the first terminal from corrosion and break.

As a result, it is possible to improve the reliability in electrical connection between the first terminal and the second terminal. According to this configuration, the layout of lines is not complicated and the increase in cost due to the layout of lines is not caused, compared with the configurations described in JP-A-2001-332820 and JP-A-11-142871.

In the mounting structure, it is preferable that the different terminal is formed on only one side of the island-shaped conductive on the first substrate.

According to another aspect of the invention, there is provided an electro-optical device having the above-mentioned mounting structure. Accordingly, it is possible to provide an electro-optical device having a mounting structure with high reliability in electrical connection.

In the electro-optical device, it is preferable that the first substrate is one of a pair of substrates between which an electro-optical material is interposed and the second substrate is a flexible circuit board.

According to another aspect of the invention, there is provided an electronic apparatus having the above-mentioned electro-optical device as a display unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to the accompanying drawings.

First Embodiment

Configuration of Liquid Crystal Device

A configuration of a liquid crystal device 100 having a mounting structure 70 according to a first embodiment of the invention will be described now with reference to FIGS. 1 and 2. The details of the mounting structure 70 will be described later.

Figure 1:
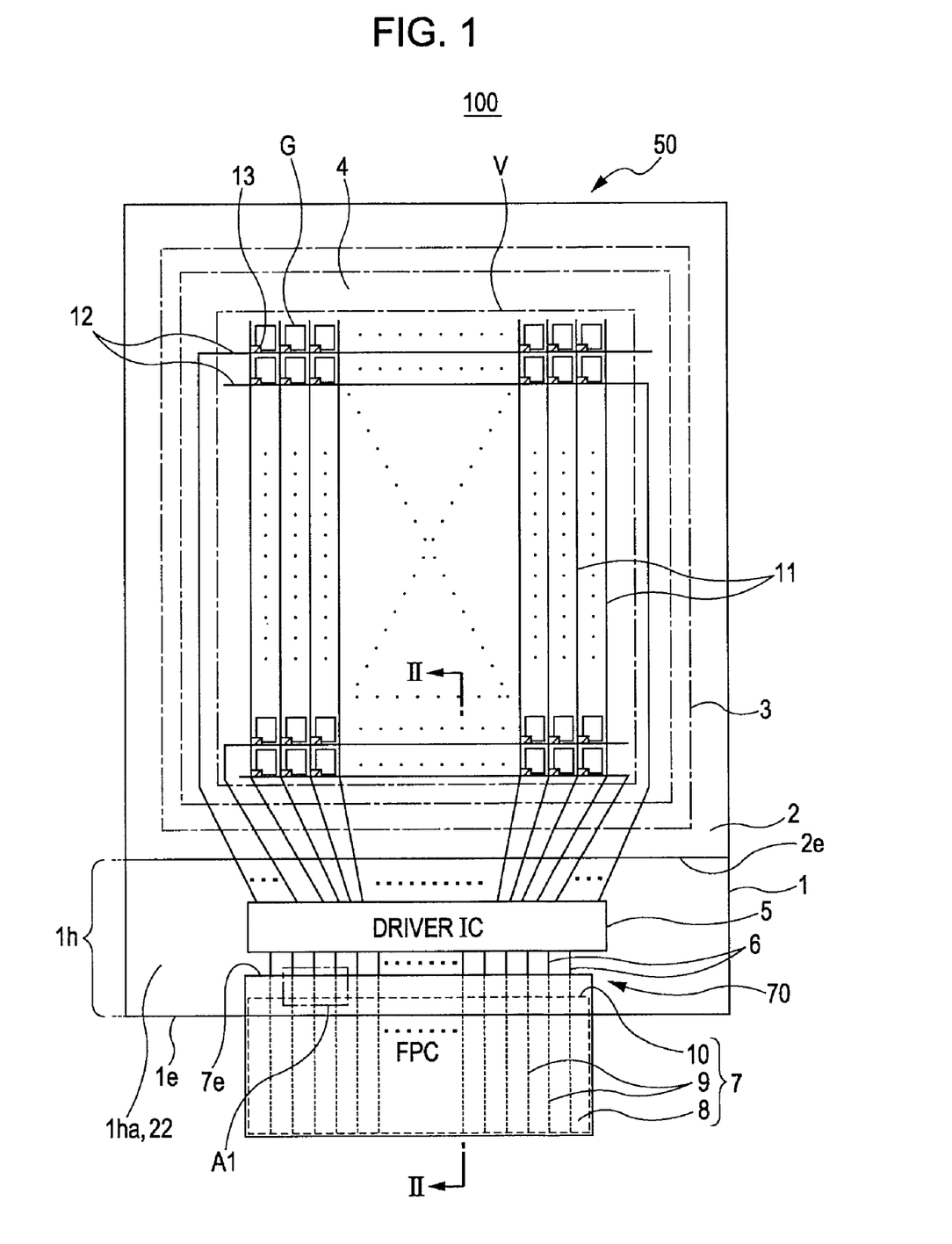
FIG. 1 is a plan view of a liquid crystal device according to a first embodiment of the invention as viewed from a viewing side.
Figure 2:
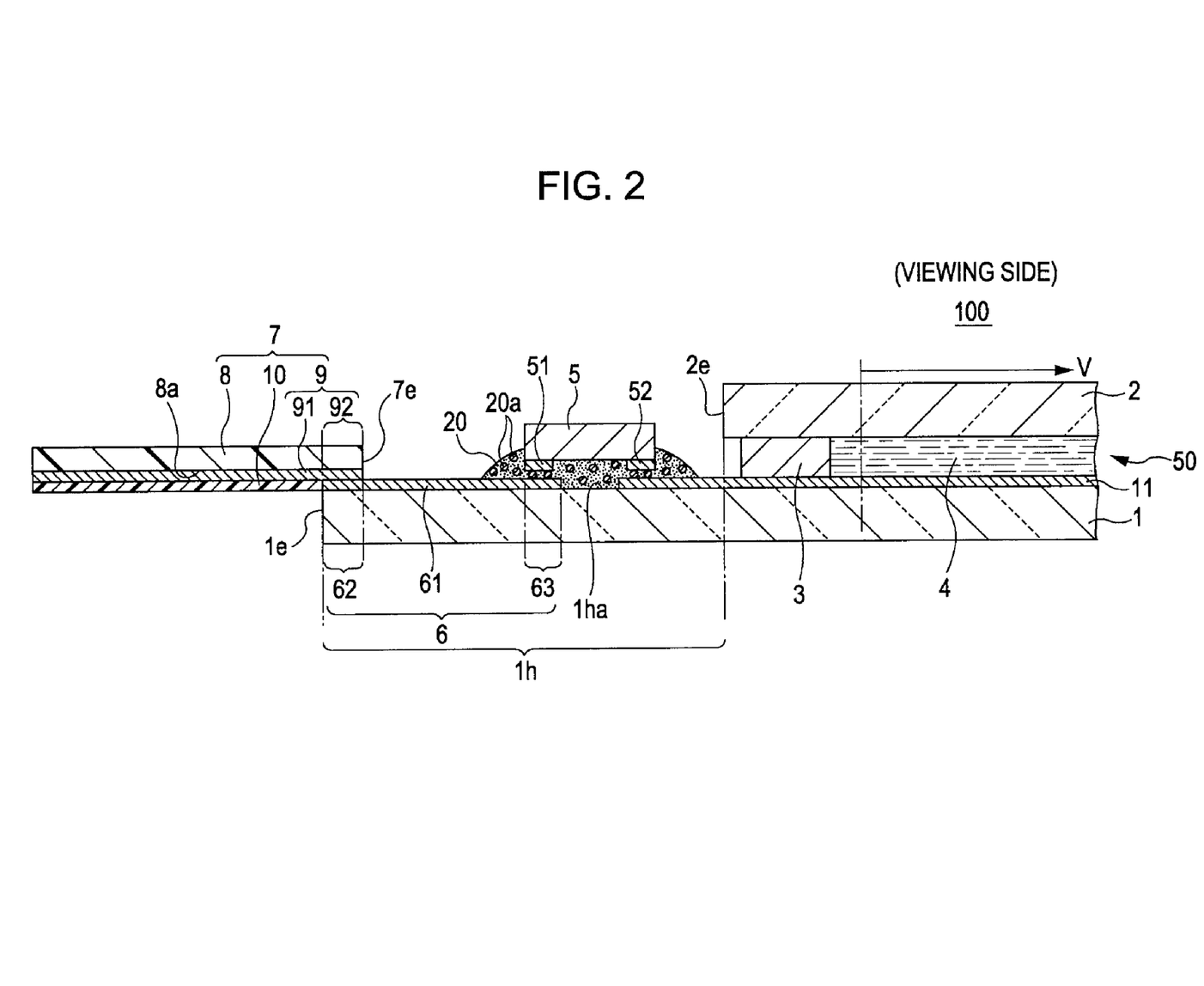
FIG. 2 is a partial sectional view of the liquid crystal device taken along line II-II of FIG. 1.

FIG. 1 is a plan view schematically illustrating a configuration of the liquid crystal device 100 as an example of an electro-optical device according to the first embodiment of the invention. FIG. 2 is a partial sectional view of the liquid crystal device 100 taken along line II-II of FIG. 1. In FIG. 2, the viewing side means an upside in the drawing and a side from which an observer views a display image.

The liquid crystal device 100 according to the first embodiment includes a liquid crystal display panel 50 as an example of an electro-optical panel and a flexible printed circuit (FPC) 7 as an example of a circuit board. In this embodiment, the liquid crystal panel 50 is not limited to a specific configuration, but may employ various known configurations.

In the liquid crystal display panel 50, a substrate 1 formed of a light-transmitting material such as glass and a counter substrate 2 formed of the same material as the substrate 1 are bonded to each other with a frame-like sealing member 3 and a liquid crystal layer (electro-optical material) 4 is disposed in a zone defined by the substrate 1, the counter substrate 2, and the frame-like sealing member 3.

Plural signal lines 11, plural scanning lines 12, plural thin film transistor (TFT) elements 13 as an example of a switching element, and plural pixel electrodes G are formed on a surface of the substrate 1 facing the liquid crystal layer 4. In addition, many elements such as black matrixes, color filters, and other electrodes are formed in a matrix shape (lattice shape) or in a stripe shape (linear shape) on an inner surface of the liquid crystal panel 50 facing the liquid crystal layer 4, but they are not shown in FIGS. 1 and 2.

The pixel electrodes G are formed of a transparent conductive film such as indium tin oxide (ITO) and are arranged in a matrix shape inside the frame-like sealing member 3. The area in which the pixel electrodes G are arranged in a matrix shape is an effective display area (image display section) V displaying an image such as characters or pictures. The substrate 1 includes a protruding area (mounting area) 1h protruding outward from one end 2e of the counter substrate 2. Electronic components including a driver integrated circuit (IC) 5 driving the liquid crystal and the FPC 7 and plural external connection lines 6 are mounted or formed on a surface 1ha of the mounting area 1h (hereinafter, referred to as "mounting area surface") facing the counter substrate 2.

The driver IC 5 includes plural input terminals 51 and plural output terminals 52.

The external connection lines 6 are formed of a conductive metal film of aluminum, etc. Each external connection line 6 includes a main line 61 and terminals 62 and 63 disposed on both sides of the main line 61. The external connection lines 6 extend from one end 1e of the mounting area 1h to a position two-dimensionally overlapping with the input terminals 51 of the driver IC 5. The terminals 62 of the external connection lines 6 are electrically connected to terminals 92 disposed at one end 7e of the FPC 7 to be described later and the terminals 63 of the external connection lines 6 are electrically connected to the input terminals 51 of the driver IC 5.

On the mounting area surface 1ha of the substrate 1, the area other than the input terminals 51 and the output terminals 52 of the driver IC 5 and the area other than at least a part of the terminals 62 and 63 of the lines 6 are covered with a protective layer 22 (see FIG. 3B) formed of, for example, silicon resin.

The signal lines 11 extend from the mounting area 1h to the effective display area V. Ends of the signal lines 11 are electrically connected to the output terminals 52 of the driver IC 5 through conductive particles 20a included in an anisotropic conductive adhesive 20 and image signals are supplied to the signal lines 11 from the driver IC 5.

The scanning lines 12 are drawn from the mounting area 1h to the area between the sealing member 3 and the effective display area V and further extend to the effective display area V in a direction intersecting the signal lines 11. Ends of the scanning lines 12 are electrically connected to the output terminals 52 of the driver IC 5 through the conductive particles 20a included in the anisotropic conductive adhesive 20 and scanning signals are supplied to the scanning lines 12 from the driver IC 5 at a predetermined time.

The TFT elements 13 are elements controlling the switching of the pixel electrodes G and are arranged to correspond to intersections of the signal lines 11 and the scanning lines 12. Although not shown, the respective TFT elements 13 include a source electrode electrically connected to the corresponding signal line 11, a gate electrode electrically connected to the corresponding scanning line 12, and a drain electrode electrically connected to the corresponding pixel electrode G.

The FPC 7 includes a base layer (base film) 8 having an insulating property and flexibility, plural lines 9 formed on one surface 8a of the base layer 8, and a cover layer (coverlay) 10 formed on one surface 8a of the base layer 8 to cover main lines 91 of lines 9 to be described later. The lines 9 are formed of a conductive metal film and the surface of the metal film is plated with corrosion-resistance gold or the like. The respective lines 9 have a main line 91 and a terminal 92 disposed at one end of the main line 91. The lines 9 are arranged on one surface 8a of the base layer 8 with a proper gap therebetween. The cover layer 10 is formed of an insulating and flexible material such as polyimide.

In the liquid crystal device 100 having the above-mentioned configuration, by supplying various electrical signals (for example, the image signals to the signal lines 11 and the scanning signals to the scanning lines 12) to the liquid crystal display panel 50 through the FPC 7 from an electronic apparatus to be described later, an alignment control of liquid crystal molecules in the liquid crystal layer 4 is made and thus a desired display image is viewed by an observer.

Configuration of Mounting Structure

A configuration of the mounting structure 70 according to the first embodiment of the invention will be described now with reference to FIGS. 3A and 3B.

Figure 3A:
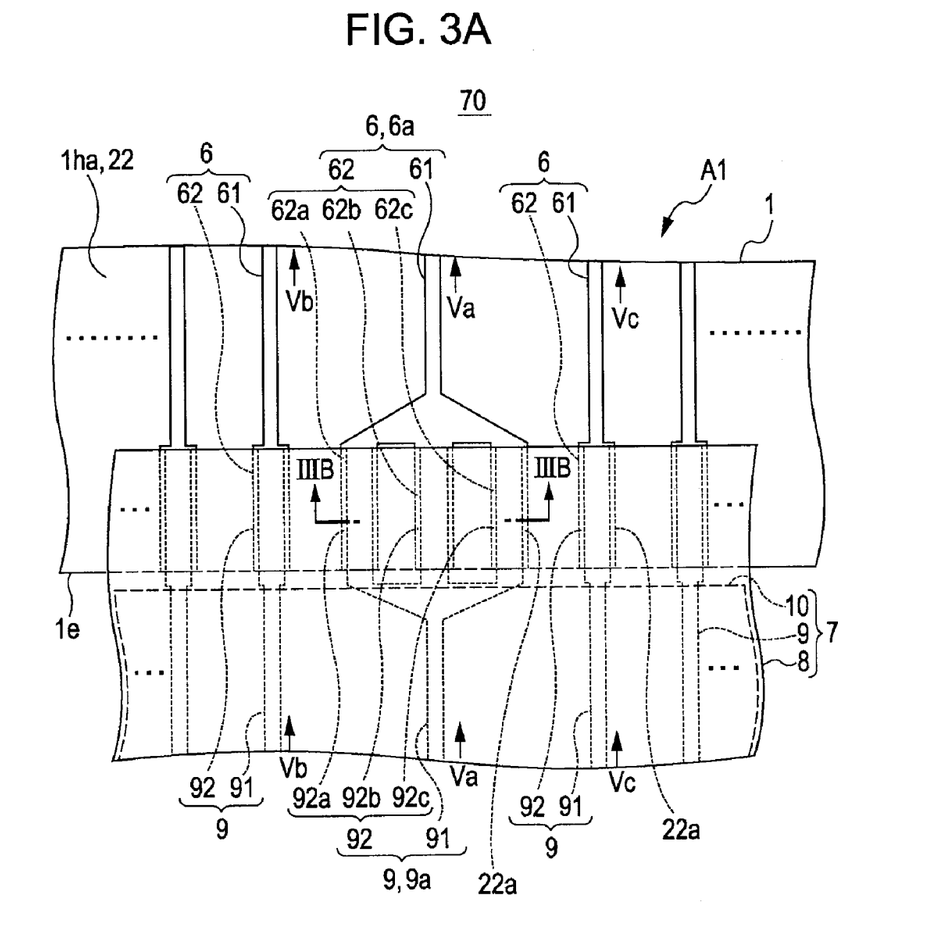
FIGS. 3A and 3B are a partial plan view and a partial sectional view illustrating a mounting structure according to the first embodiment of the invention, respectively.
Figure 3B:
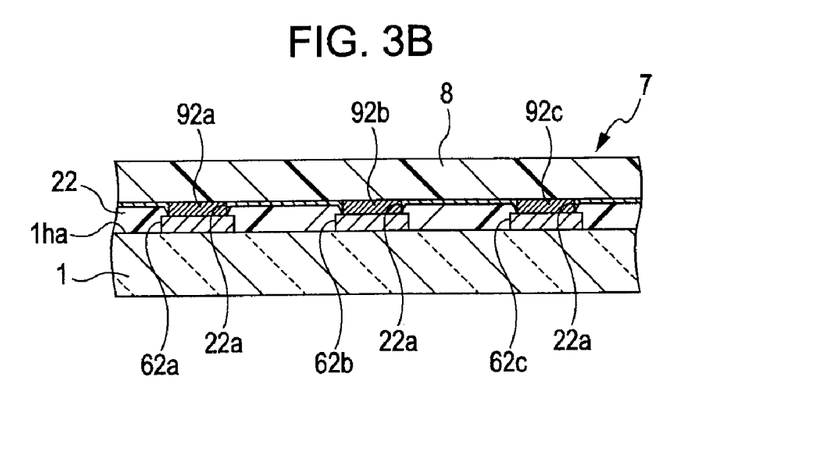

FIG. 3A is a partially enlarged plan view of the mounting structure 70 corresponding to a broken-line area A1 of FIG. 1. FIG. 3B is a partial sectional view of the mounting structure 70 taken along line IIIB-IIIB of FIG. 3A.

In the mounting structure 70 according to the first embodiment, the substrate (first substrate) 1 and the FPC (second substrate) 7 are electrically connected to each other through the terminals 62 and 92 and an electrical connection structure between one or more terminals 62 and terminals 92 of the plural terminals 62 and 92 is a specific feature of the first embodiment.

Specifically, plural external connection lines 6 with a proper gap therebetween are arranged on the mounting area surface 1ha of the substrate 1 constituting the mounting structure 70. Here, paying attention to the terminal 62 of one line 6a of the plural external connection lines 6, the terminal 62 of the line 6a includes three terminal portions 62a, 62b, and 62c to form a first terminal. Openings 22a of the protective layer 22 are formed at positions corresponding to the three terminal portions 62a, 62b, and 62c. The terminal 62 of the respective lines 6 disposed on both sides of the terminal 62 of the line 6a includes one terminal portion. However, the invention is not limited to the configuration, but the terminal 62 of the respective lines 6 disposed on both sides of the terminal 62 of the line 6a may have the same configuration as the terminal 62 of the line 6a.

On the other hand, plural lines 9 with a proper gap therebetween are arranged on one surface 8a of the base layer 8 of the FPC 7 constituting the mounting structure 70. Here, paying attention to the terminal 92 of one line 9a of the plural lines 9, the terminal 92 of the line 9a includes three terminal portions 92a, 92b, and 92c to form a second terminal. The terminal 92 of the respective lines 9 disposed on both sides of the terminal 92 of the line 9a includes one terminal portion. However, the invention is not limited to the configuration, but the terminal 92 of the respective lines 9 disposed on both sides of the terminal 92 of the line 9a may have the same configuration as the terminal 92 of the line 9a.

In addition, the three terminal portions 62a, 62b, and 62c of the line 6a are electrically connected to the three terminal portions 92a, 92b, and 92c of the line 9a. The terminals 62 of the lines 6 disposed on both sides of the terminal 62 of the line 6a are electrically connected to the terminals 92 of the lines 9 disposed on both sides of the terminal 92 of the line 9a. In this configuration, the line 6a of the substrate 1 is supplied with a potential Va higher than the potentials Vb and Vc supplied to the lines 6 disposed on both sides of the line 6a of the substrate 1 through the lines 9a of the FPC 7. For example, the line 6a of the substrate 1 is considered as a source voltage line supplied with a high plus potential.

An example of operational advantages of the mounting structure 70 according to the first embodiment will be described now in comparison with a comparative example.

First, a mounting structure in which the terminal 62 of the line 6a and the terminal 92 of the line 9a in the mounting structure 70 have a single terminal portion is assumed as a comparative example. When this mounting structure is used, for example, under a high-temperature and high-humidity environment, a possible problem will be described now.

In the comparative example, it is assumed that a high potential (for example, 6 V) Va is applied to the line 6a and a potential (for example, a reference potential of 0 V) Vb and Vc lower than that of the line 6a is applied to the lines 6 on both sides of the line 6a under the high-temperature and high-humidity environment. In this case, since a great potential difference exists between the line 6a and the lines 6 on both sides thereof, the terminals 62 of the lines 6a on both sides may be corroded and broken by the electrochemical reaction generated by applying an electric field to the moisture permeated from the outside or the like and the impurity ions included in the mounting structure. Even when the potential difference between the terminals is low, the terminals may be corroded and broken for another reason or because of use of terminals that can be easily corroded. Since the terminal 92 of the line 9a is formed of a metal film and the surface of the metal film is plated with gold or the like having corrosion resistance, the terminal 92 of the line 9a is hardly corroded and broken. When the corrosion resistance is enhanced, the line resistance tends to increase. Accordingly, the comparative example may have a problem with a decrease in reliability of the electrical connection of the mounting structure.

Accordingly, in the mounting structure 70 according to the first embodiment, the terminal 62 of the line 6a includes three terminal portions 62a, 62b, and 62c, the terminal 92 of the line 9a includes three terminal portions 92a, 92b, and 92c, and the three terminal portions 62a, 62b, and 62c are electrically connected to the three terminal portions 92a, 92b, and 92c, respectively.

According to this configuration, the following operational advantages can be obtained. That is, it is assumed that the liquid crystal device 100 having the mounting structure 70 is used, for example, under a high-temperature and high-humidity environment, a potential (for example 6 V) Va is applied to the line 6a, and potentials (for example, a reference potential of 0 V) Vb and Vc lower than that of the line 6a are applied to the lines 6 on both sides of the line 6a. In this case, since a great potential difference exists between the line 6a and the lines 6 on both sides thereof, two terminal portions 62a and 62c of the terminal portions 62a, 62b, and 62c of the line 6a having the higher potential may be corroded and broken due to the electrochemical reaction.

However, since an equivalent potential is applied to the terminal portions 62a, 62b, and 62c of the line 6a, at least one inner terminal portion 62b of the line 6a among the terminal portions 62a, 62b, and 62c of the line 6a has a potential difference of about 0 V from the terminal portions 62a and 62c of the line 6a located on both sides thereof. As a result, the electrochemical reaction hardly occurs and the terminal portions 62a and 62c of the line 6a and the terminal portions 92a and 92c of the line 9a serve as a barrier, whereby it is possible to prevent the inner terminal portion 62b of the line 6a from corrosion and break. Since the terminal 92 of the line 9a is formed of a metal film and the surface of the metal film is plated with gold or the like having corrosion resistance, the terminal 92 of the line 9a is hardly corroded and broken.

As a result, it is possible to improve the reliability in electrical connection between the first terminal and the second terminal of the mounting structure 70. According to this configuration, the layout of the lines 6 and 9 is not complicated and the increase in cost due to the layout of the lines 6 and 9 is not caused, compared with the configurations described in JP-A-2001-332820 and JP-A-11-142871.

In the comparative example, to prevent the terminal portions from the corrosion and break due to the electrochemical reaction, it is effective that the distance between the terminal 62 of the line 6a and the terminals 62 of the lines 6 located on both sides thereof is as great as possible. However, since the outer sizes of the substrate 1 and the FPC 7 are restricted depending on specifications thereof, the increase in distance is limited. On the contrary, in the first embodiment, since the terminal portion 62b of the line 6a can be prevented from the corrosion and break thanks to the above-mentioned configuration, the distance between the terminal 62 of the line 6a and the terminals 62 of the lines 6 located on both sides thereof can be set small.

In the first embodiment, the terminal 62 of the line 6a includes three terminal portions 62a, 62b, and 62c and the terminal 92 of the line 9a includes three terminal portions 92a, 92b, and 92c. However, the invention is not limited to this configuration, but in this embodiment, the terminal 62 of the line 6a may include three or more terminal portions and the terminal 92 of the line 9a may include three or more terminal portions.

For example, the number of terminal portions included in the respective terminals 92 and 62 of the lines 9a and 6a can be preferably determined depending on the relation between the magnitudes of current flowing in the lines 9a and 6a.

That is, when the number of terminal portions included in the respective terminals 92 and 62 of the lines 9a and 6a is three like the first embodiment, the terminal portions having the possibility of losing the electrical connection function due to the corrosion and break are two terminal portions (terminal portions 92a and 92c and terminal portions 62a and 62c) at most as described above. Here, when the number of terminal portions included in the terminals 92 and 62 of the lines 9a and 6a increases, the areas of the terminals 92 and 62 of the lines 9a and 6a increase thereby and the resistance thereof decreases. Accordingly, in consideration of this point, when the potentials applied to the lines 9a and 6a but the magnitudes of current flowing in the lines 9a and 6a are small, the terminal portion 62b located inside at least one of the terminal portions 62a and 62c of the line 6a and the terminal portion 92b located inside at least one of the terminal portions 92a and 92c of the line 9a can be left to supply proper signals to the terminals 92 and 62 of the lines 9a and 6a. However, when the magnitudes of the current flowing in the lines 9a and 6a are great, three terminals portions included in the respective terminals 92 and 62 of the lines 9a and 6a may be insufficient to supply the proper signals to the terminals 92 and 62 of the lines 9a and 6a. Accordingly, in this case, it is preferable that four or more terminal portions may be provided in the respective terminals 92 and 62 of the lines 9a and 6a to supply the proper signals to the terminals 92 and 62 of the lines 9a and 6a. Therefore, when four or more terminal portions are provided in the respective terminals 92 and 62 of the lines 9a and 6a, at least two or more terminal portions among the terminal portions are hardly influenced by the corrosion and break.

Second Embodiment

A configuration of a mounting structure 71 according to a second embodiment of the invention will be described now with reference to FIGS. 4A and 4B.

Figure 4A:
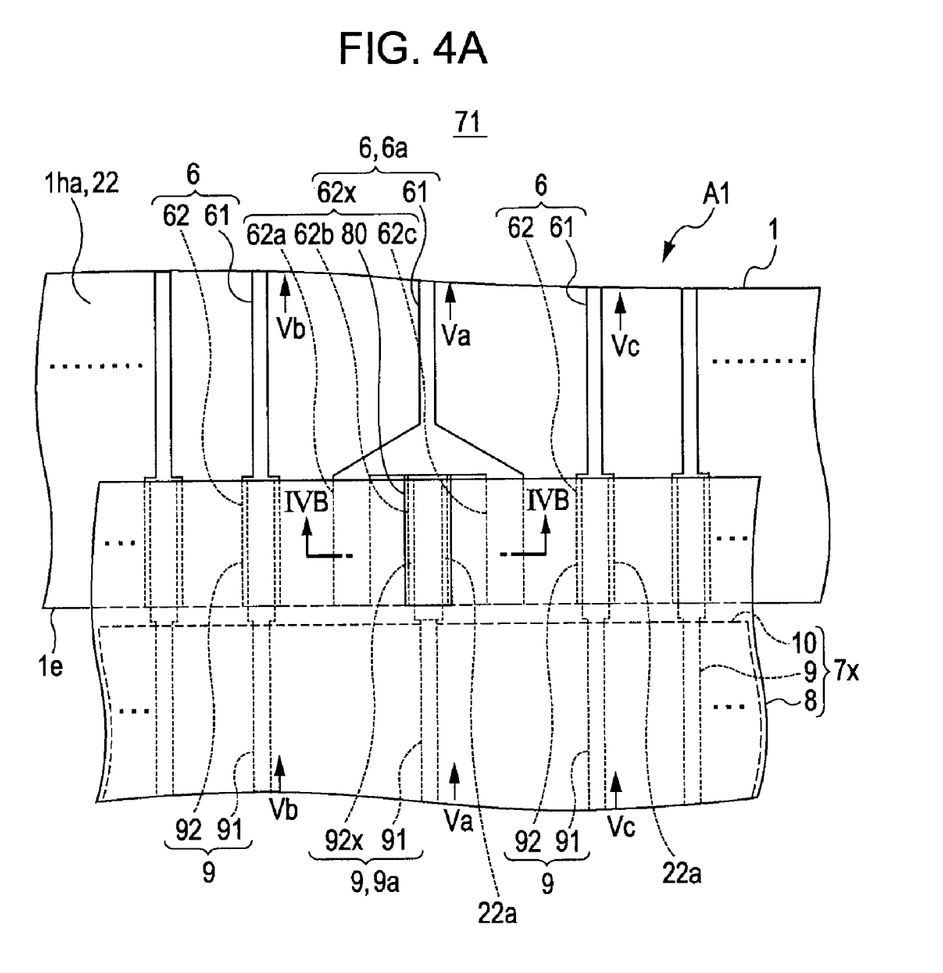
FIGS. 4A and 4B are a partial plan view and a partial sectional view illustrating a mounting structure according to a second embodiment of the invention, respectively.
Figure 4B:
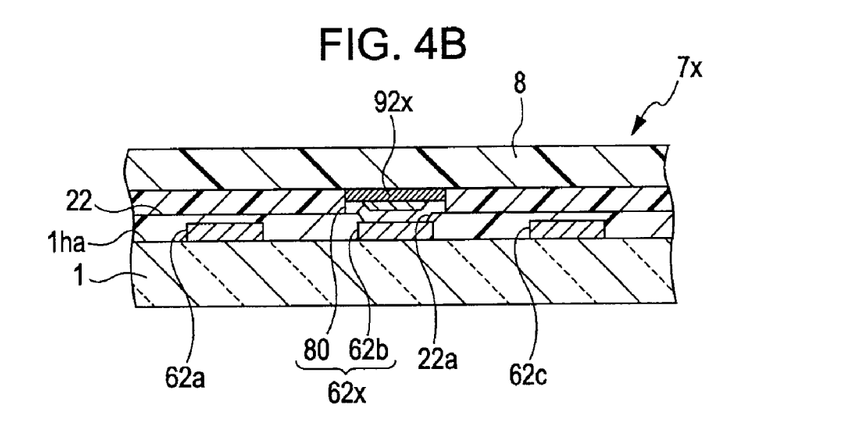

FIG. 4A is a partially enlarged plan view of the mounting structure 71 according to the second embodiment, which corresponds to FIG. 3A. FIG. 4B is a partial sectional view of the mounting structure 71 taken along line IVB-IVB of FIG. 4A.

The second embodiment and the first embodiment are different from each other in the terminal structure corresponding to the terminal 62 of the line 6a in the substrate 1 and the configuration of the line 9a in the FPC electrically connected to the line 6a and both are equal to each other in the other configuration. Accordingly, like reference numerals are given to elements like those of the first embodiment and description thereof is properly omitted.

Specifically, paying attention to a terminal 62x of one line 6a of plural external connection lines 6 in the substrate 1 of the mounting structure 71, the terminal 62x of the line 6a is formed as a first terminal including three terminal portions 62a, 62b, and 62c formed of a metal film and a corrosion-resistance conductive film (for example, a transparent conductive film of ITO or the like) 80. The conductive film 80 is disposed at a position covering the terminal portion 62b and at a position overlapping with the terminal portion 62b in a plan view. On the other hand, paying attention to a terminal 92x of a line 9a of plural lines 9 in an FPC 7x of the mounting structure 71, the terminal 92x of the line 9a is formed as a second terminal including one terminal portion. The terminal portion is formed of a metal film and the surface of the metal film is plated with gold or the like having corrosion resistance. The FPC 7x and the FPC 7 are different from each other in the terminal configuration of the line 9a and both are equal to each other in the other configuration.

The conductive film 80 covering the terminal portion 62b of the three terminal portions 62a, 62b, and 62c of the line 6a is electrically connected to the terminal portion 62b through an opening 22a of the protective layer 22. The terminal 62x of the line 6a of the substrate 1 is supplied with a potential Va higher than potentials Vb and Vc supplied to the lines 6 located on both sides of the line 6a of the substrate 1 through the line 9a of the FPC 7x. For example, the line 6a including the terminal 62x can be considered as a source voltage line supplied with a plus high potential.

In the mounting structure 71 according to the second embodiment having the above-mentioned configuration, the terminal portion 62b of the three terminal portions 62a, 62b, and 62c of the line 6a is covered with the corrosion-resistance conductive film 80. Accordingly, when the mounting structure 71 is used, for example, under a high-temperature and high-humidity environment, a high potential (for example, 6V) Va is applied to the line 6a, and potentials (for example, a reference potential of 0 V) Vb and Vc lower than that of the line 6a are applied to the lines 6 located on both sides of the line 6a, a great potential difference exists between the line 6a and the lines 6 located on both sides thereof. Accordingly, two terminal portions 62a and 62c of the line 6a having the higher potential may be corroded and broken by the electrochemical reaction.

However, since an equivalent potential is applied to the terminal portions 62a, 62b, and 62c of the line 6a, at least one inner terminal portion 62b of the line 6a among the terminal portions 62a, 62b, and 62c of the line 6a has a potential difference of about 0 V from the terminal portions 62a and 62c of the line 6a located on both sides thereof. As a result, the electrochemical reaction hardly occurs and the terminal portions 62a and 62c of the line 6a, the corrosion-resistance conductive film 80, and the terminal portions 92x of the line 9a serve as a barrier, whereby it is possible to prevent the inner terminal portion 62b of the line 6a from corrosion and break. Since the terminal 92x of the line 9a is formed of a metal film and the surface of the metal film is plated with gold or the like having corrosion resistance, the terminal 92x of the line 9a is hardly corroded and broken.

According to this embodiment, since the terminal portion 62b of the first terminal is covered with the corrosion-resistance conductive film 80 unlike the first embodiment, the electrochemical reaction further hardly occurs in the terminal portion 62b of the line 6a and thus the terminal 62x of the line 6a can be prevented from the corrosion and break. Like the first embodiment, the respective terminals 92 and 62 of the lines 9a and 6a may include four or more terminal portions. In this case, two or more inner terminal portions of the terminal portions of the line 6a may be covered with the corrosion-resistance conductive film 80. According to this configuration, the two or more inner terminal portions can be further prevented from the corrosion and break.

As a result, it is possible to improve the reliability in electrical connection between the first terminal and the second terminal of the mounting structure 71. According to this configuration, the layout of the lines 6 and 9 is not complicated and the increase in cost due to the layout of the lines 6 and 9 is not caused, compared with the configurations described in JP-A-2001-332820 and JP-A-11-142871.

Third Embodiment

A configuration of a mounting structure 72 according to a third embodiment of the invention will be described now with reference to FIGS. 5A and 5B.

Figure 5A:
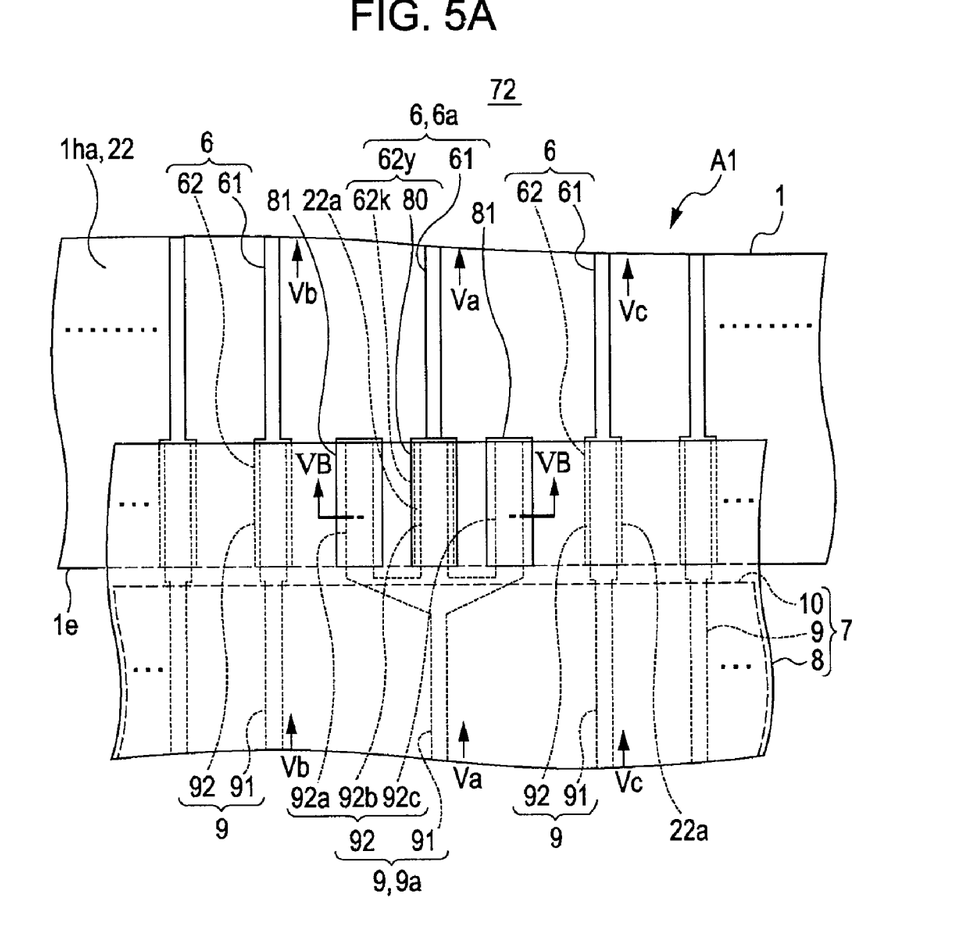
FIGS. 5A and 5B are a partial plan view and a partial sectional view illustrating a mounting structure according to a third embodiment of the invention, respectively.
Figure 5B:
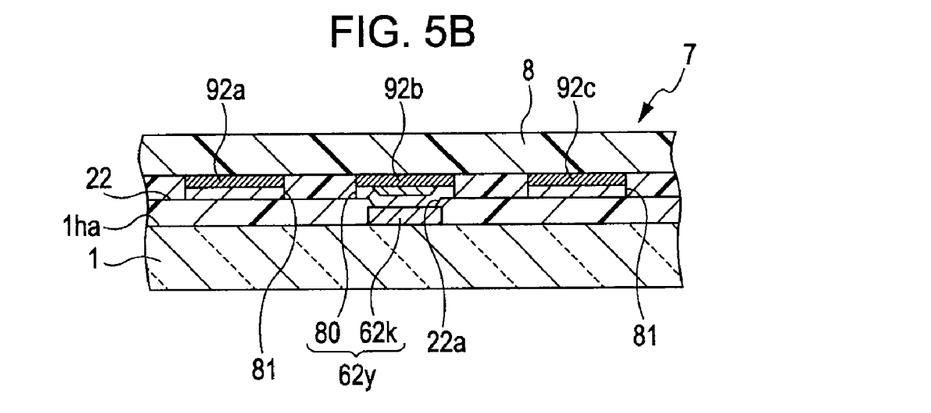

FIG. 5A is a partially enlarged plan view of the mounting structure 72 according to the third embodiment, which corresponds to FIG. 3A. FIG. 5B is a partial sectional view of the mounting structure 72 taken along line VB-VB of FIG. 5A.

The third embodiment and the first embodiment are different from each other in the terminal structure corresponding to the terminal 62 of the line 6a in the substrate 1 and both are equal to each other in the other configuration. Accordingly, like reference numerals are given to elements like those of the first embodiment and description thereof is properly omitted.

Specifically, paying attention to a terminal 62y of one line 6a of plural external connection lines 6 in the substrate 1 of the mounting structure 72, the terminal 62y of the line 6a is formed as a first terminal including one terminal portion 62k formed of a metal film and a corrosion-resistance conductive film (for example, a transparent conductive film of ITO or the like) 80. The conductive film 80 is disposed at a position covering the terminal portion 62k and at a position overlapping with the terminal portion 62k in a plan view. In the mounting structure 72, a pair of corrosion-resistance island-shaped conductive film (for example, transparent conductive films of ITO or the like) 81 is disposed on both sides of the terminal 62y on the substrate 1. On the other hand, the configuration of the FPC 7 of the mounting structure 72 is equal to that of the first embodiment and a terminal 92 of one line 9a of plural lines 9 is formed as a second terminal including three terminal portions 92a, 92b, and 92c. The conductive film 80 covering the terminal 62y of the line 6a is electrically connected to the terminal portion 62k through an opening 22a of the protective layer 22 and is electrically connected to the terminal portion 92b of the line 9a in the FPC 7. The pair of conductive films 81 is electrically connected to the terminal portions 92a and 92c of the line 9a in the FPC 7, respectively.

In this configuration, the terminal 62y of the line 6a of the substrate 1 is supplied with a potential Va higher than potentials Vb and Vc supplied to the lines 6 located on both sides of the line 6a through the line 9a of the FPC 7. For example, the line 6a including the terminal 62y can be considered as a source voltage line supplied with a plus high potential.

In the mounting structure 72 according to the third embodiment, the following operational advantages can be obtained.

That is, in the mounting structure 72, the terminal 62y of the line 6a includes one terminal portion 62k formed of a metal film and the corrosion-resistance conductive film 80 covering the terminal portion 62k. A pair of corrosion-resistance conductive films 81 is disposed on both sides of the terminal 62y of the line 6a. Accordingly, when the liquid crystal device having the mounting structure 72 is used, for example, under a high-temperature and high-humidity environment, a high potential (for example, 6 V) Va is applied to the lines 6a and 9a, and low potentials (for example, a reference potential of 0 V) Vb and Vc are applied to the lines 6 located on both sides of the line 6a, a great potential difference exists between the line 6a and the lines 6 located on both sides thereof. Accordingly, the pair of corrosion-resistance conductive films 81 located on both sides of the terminal 62y of the line 6a may be corroded and broken by the electrochemical reaction.

However, since an equivalent potential is applied to the terminal portion 62y of the line 6a and the pair of corrosion-resistance island-shaped conductive films 81 located on both sides thereof, the terminal portion 62y of the line 6a has a potential difference of about 0 V from the pair of corrosion-resistance island-shaped conductive films 81 located on both sides thereof. As a result, the electrochemical reaction hardly occurs and the conductive film 80 constituting the terminal 62y of the line 6a and the pair of corrosion-resistance conductive films 81 located on both sides thereof serve as a barrier, whereby it is possible to prevent the terminal portion 62k of the line 6a from corrosion and break. Since the terminal 92 of the line 9a is formed of a metal film and the surface of the metal film is plated with gold or the like having corrosion resistance, the terminal 92 of the line 9a is hardly corroded and broken.

According to this embodiment, the terminal portion 62k of the first terminal is covered with the corrosion-resistance conductive film 80 unlike the first embodiment. In addition, since the pair of corrosion-resistance conductive films 81 are disposed on both sides of the terminal 62y of the line 6a, the electrochemical reaction further hardly occurs in the terminal portion 62k of the line 6a and thus the terminal 62y of the line 6a can be prevented from the corrosion and break.

As a result, it is possible to improve the reliability in electrical connection between the first terminal of the substrate 1 in the mounting structure 72 and the pair of corrosion-resistance island-shaped conductive films 81 located on both sides thereof and the second terminal of the substrate 2. According to this configuration, the layout of the lines 6 and 9 is not complicated and the increase in cost due to the layout of the lines 6 and 9 is not caused, compared with the configurations described in JP-A-2001-332820 and JP-A-11-142871.

Fourth Embodiment

A configuration of a mounting structure 73 according to a fourth embodiment of the invention will be described now with reference to FIGS. 6A and 6B.

Figure 6A:
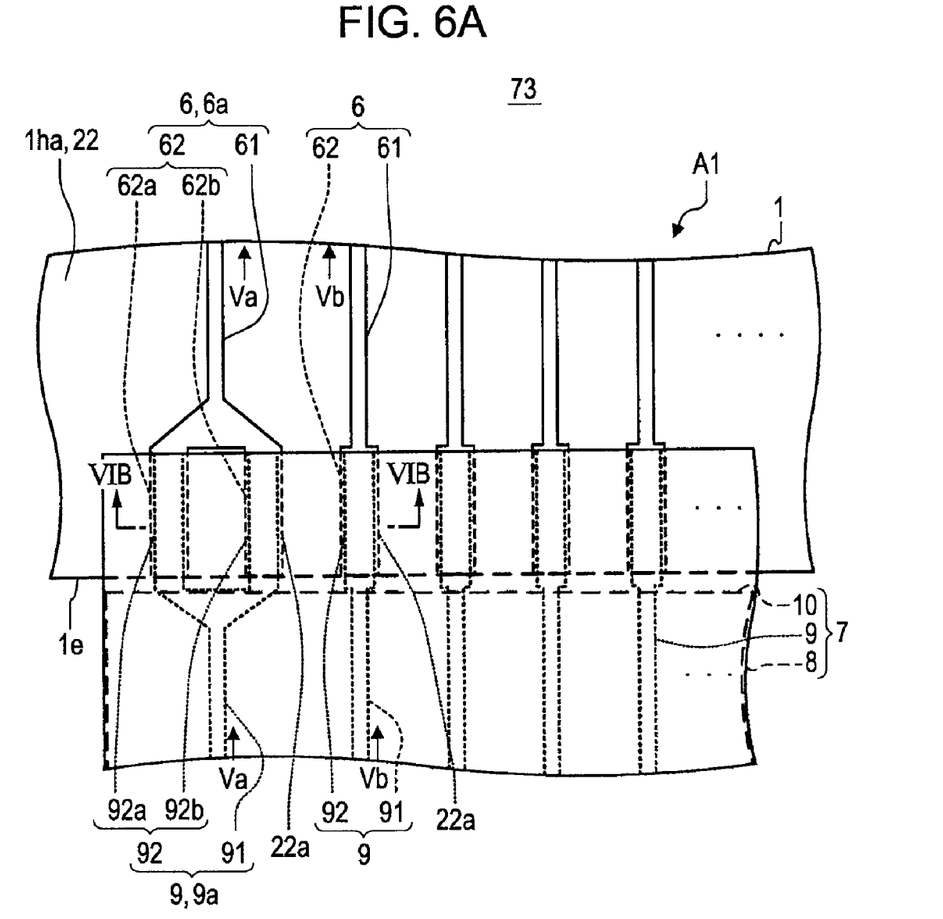
FIGS. 6A and 6B are a partial plan view and a partial sectional view illustrating a mounting structure according to a fourth embodiment of the invention, respectively.
Figure 6B:
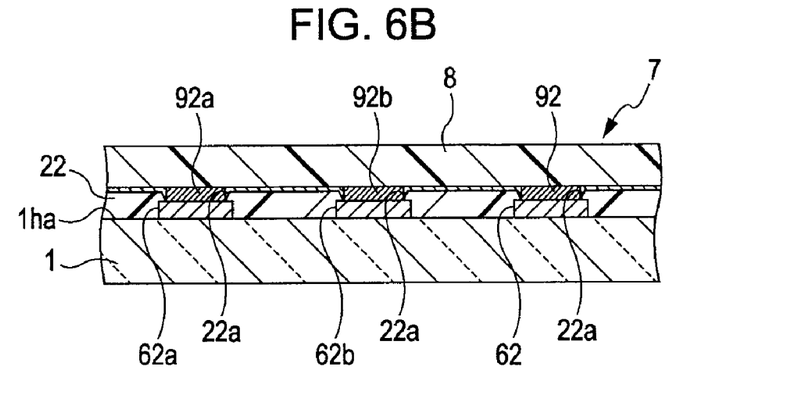

FIG. 6A is a partially enlarged plan view of the mounting structure 73 according to the fourth embodiment, which corresponds to FIG. 3A. FIG. 6B is a partial sectional view of the mounting structure 73 taken along line VIB-VIB of FIG. 6A.

The fourth embodiment and the first embodiment are different from each other in the terminal structure corresponding to the terminal 62 of the line 6a in the substrate 1 and the configuration of the line 9a in the FPC 7 electrically connected to the line 6a and both are equal to each other in the other configuration. Accordingly, like reference numerals are given to elements like those of the first embodiment and description thereof is properly omitted.

Specifically, plural external connection lines 6 are arranged with a proper gap on the mounting area surface 1ha of the substrate 1 of the mounting structure 73. Here, paying attention to a terminal 62 of one line 6a of the plural external connection lines 6, the terminal 62 of the line 6a is formed as a first terminal including two terminal portions 62a and 62b. Openings 22a of the protective layer 22 are formed at positions corresponding to the two terminal portions 62a and 62b. The respective terminals 62 of the lines 6 adjacent to one side of the terminal 62 of the line 6a include one terminal portion. However, this embodiment is not limited to the configuration, but the terminals 62 of the lines 6 adjacent to one side of the terminal 62 of the line 6a may have the same configuration as the terminal 62 of the line 6a. No line is provided to the other side of the terminal 62 of the line 6a. For example, the line 6a is the outermost line of the external connection lines 6 arranged on the mounting area surface 1ha of the substrate 1. However, this embodiment is not limited to the configuration, but a line supplied with a potential equivalent to that of the line 6a may be disposed on the other side of the terminal 62 of the line 6a.

On the other hand, plural lines 9 are arranged with a proper gap on one surface 8a of the base layer 8 of the FPC 7 constituting the mounting structure 73. Here, paying attention to a terminal 92 of one line 9a of the plural lines 9, the terminal 92 of the line 9a is formed as a second terminal including two terminal portions 92a and 92b. The terminal 92 of the line 9 adjacent to one side of the terminal 92 of the line 9a includes one terminal portion. However, this embodiment is not limited to the configuration, but the terminal 92 of the line 9 adjacent to one side of the terminal 92 of the line 9a may have the same configuration as the terminal 92 of the line 9a. No line is provided to the other side of the terminal 92 of the line 9a. For example, the line 9a is the outermost line of the plural lines 9 arranged on the surface 8a of the base layer 8 of the FPC 7. However, this embodiment is not limited to the configuration, but a line supplied with a potential equivalent to that of the line 9a may be disposed on the other side of the terminal 92 of the line 9a.

The number of terminal portions of the terminal 92 of the line 9a is not limited two, but may be three or more.

The two terminal portions 62a and 62b of the line 6a are electrically connected to the two terminal portions 92a and 92b of the line 9a, respectively. The terminal 62 of the line 6 disposed on one side of the terminal 62 of the line 6a is also electrically connected to the terminal 92 of the line 9 disposed on one side of the terminal 92 of the line 9a. Only one terminal portion of the two or three or more terminal portions of the line 9a may be electrically connected to the two terminal portions of the line 6a. In this case, the terminal portion 62a not adjacent to (disposed on the other side of) the terminal 62 of the line 6, among the two terminal portions of the line 6a, can be electrically connected to the terminal portions of the line 9a. In the above-mentioned configuration, the line 6a of the substrate 1 is supplied with a potential Va higher than the potential Vb applied to the line 6 disposed on one side of the line 6a of the substrate 1 through the line 9a of the FPC 7. For example, the line 6a of the substrate 1 can be considered as a source voltage line supplied with a plus high potential.

In the mounting structure 73 according to the fourth embodiment having the above-mentioned configuration, the terminal 62 of the line 6a includes two terminal portions 62a and 62b and the terminal 92 of the line 9a includes two terminal portions 92a and 92b. In addition, the two terminal portions 62a and 62b are electrically connected to the two terminal portions 92a and 92b. Accordingly, when the liquid crystal device having the mounting structure 73 is used, for example, under a high-temperature and high-humidity environment, a high potential (for example, 6 V) Va is applied to the line 6a, and a potential (for example, a reference potential of 0 V) Vb lower than that of the line 6a is applied to the line 6 disposed on one side of the line 6a, a great potential difference exists between the line 6a and the line 6 disposed on one side thereof. Accordingly, one terminal portion 62b of the two terminal portions 62a and 62b of the line 6a may be corroded and broken by the electrochemical reaction.

However, since an equivalent potential is applied to the terminal portions 62a and 62b of the line 6a, one terminal portion 62a of the line 6a has a potential difference of about 0 V from the other terminal portion 62b of the line 6a. As a result, the electrochemical reaction hardly occurs and the terminal portion 62b of the line 6a and two terminal portions 92a and 92b of the line 9a serve as a barrier, whereby it is possible to prevent the terminal portion 62a of the line 6a from corrosion and break. Since the terminal 92 of the line 9a is formed of a metal film and the surface of the metal film is plated with gold or the like having corrosion resistance, the terminal 92 of the line 9a is hardly corroded and broken.

As a result, it is possible to improve the reliability in electrical connection between the first terminal and the second terminal of the mounting structure 73. According to this configuration, the layout of the lines 6 and 9 is not complicated and the increase in cost due to the layout of the lines 6 and 9 is not caused, compared with the configurations described in JP-A-2001-332820 and JP-A-11-142871.

In the comparative example, to prevent the terminal portions from the corrosion and break due to the electrochemical reaction, it is effective that the distance between the terminal 62 of the line 6a and the terminals 62 of the lines 6 located adjacent to the terminal 62 of the line 6a is as great as possible. However, since the outer sizes of the substrate 1 and the FPC 7 are restricted depending on specifications thereof, the increase in distance is limited. On the contrary, in the fourth embodiment, since the terminal portion 62a of the line 6a can be prevented from the corrosion and break thanks to the above-mentioned configuration, the distance between the terminal 62 of the line 6a and the terminals 62 of the lines 6 located adjacent to the terminal 62 can be set small.

Fifth Embodiment

A configuration of a mounting structure 74 according to a fifth embodiment of the invention will be described now with reference to FIGS. 7A and 7B.

Figure 7A:
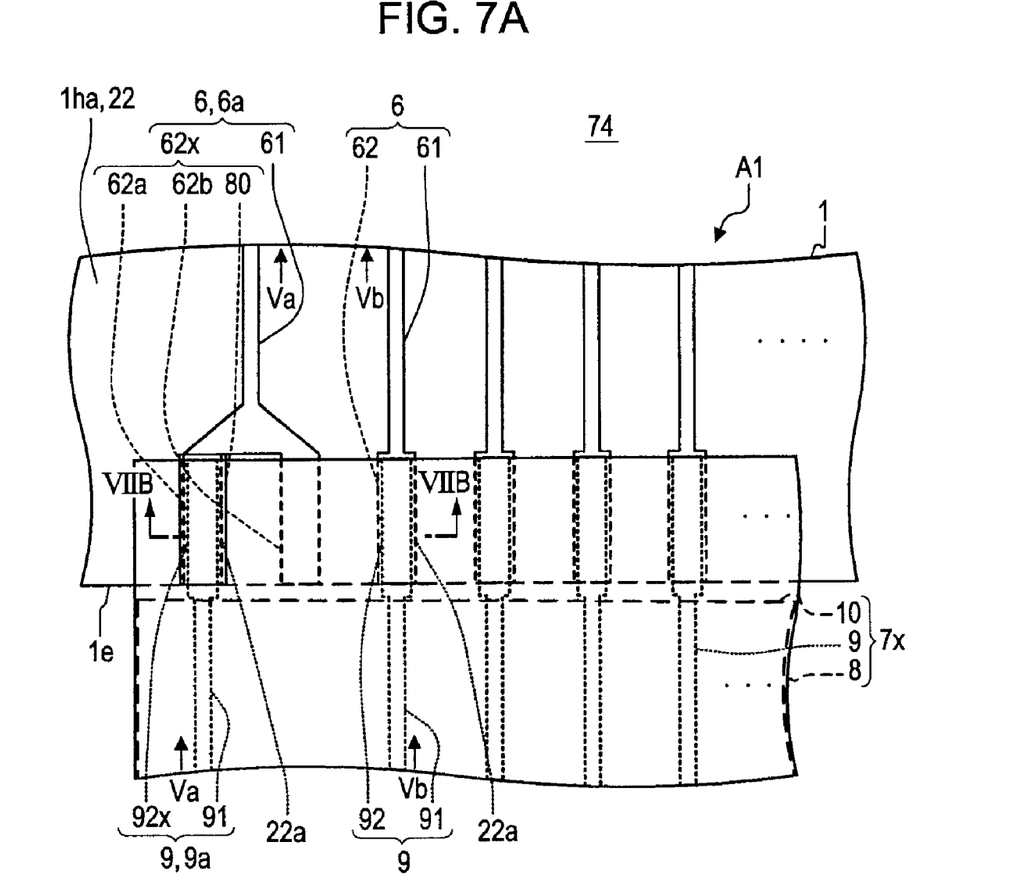
FIGS. 7A and 7B are a partial plan view and a partial sectional view illustrating a mounting structure according to a fifth embodiment of the invention, respectively.
Figure 7B:
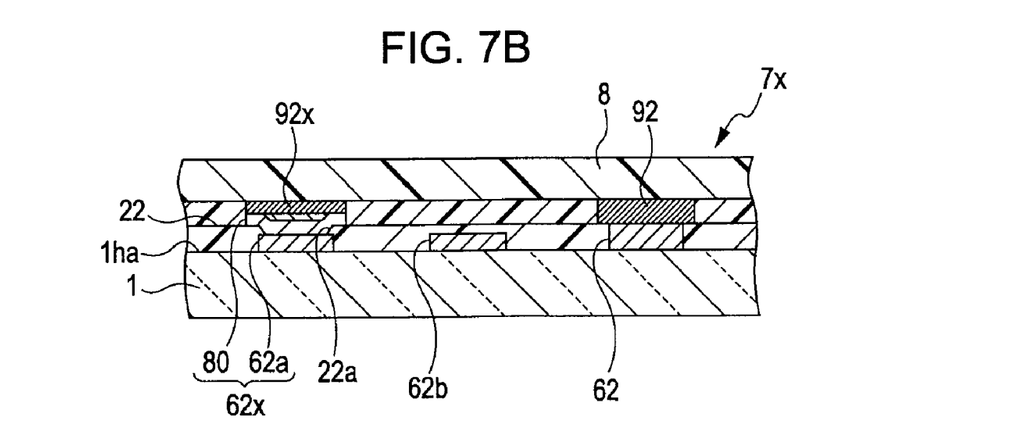

FIG. 7A is a partially enlarged plan view of the mounting structure 74 according to the fifth embodiment, which corresponds to FIG. 6A. FIG. 7B is a partial sectional view of the mounting structure 74 taken along line VIIB-VIIB of FIG. 7A.

The fifth embodiment and the fourth embodiment are different from each other in the terminal structure corresponding to the terminal 62 of the line 6a in the substrate 1 and the configuration of the line 9a in the FPC electrically connected to the line 6a and both are equal to each other in the other configuration. Accordingly, like reference numerals are given to elements like those of the fourth embodiment and description thereof is properly omitted.

Specifically, paying attention to a terminal 62x of one line 6a of plural external connection lines 6 in the substrate 1 of the mounting structure 74, the terminal 62x of the line 6a is formed as a first terminal including two terminal portions 62a and 62b formed of a metal film and a corrosion-resistance conductive film (for example, a transparent conductive film of ITO or the like) 80. The conductive film 80 is disposed at a position covering the terminal portion 62a and at a position overlapping with the terminal portion 62a in a plan view. On the other hand, paying attention to a terminal 92x of one line 9a of plural lines 9 in an FPC 7x of the mounting structure 74, the terminal 92x of the line 9a is formed as a second terminal including one terminal portion. The terminal portion is formed of a metal film and the surface of the metal film is plated with gold or the like having corrosion resistance. The FPC 7x and the FPC 7 are different from each other in the terminal configuration of the line 9a and both are equal to each other in the other configuration.

The conductive film 80 covering the terminal portion 62a of the two terminal portions 62a and 62b of the line 6a is electrically connected to the terminal portion 62a through an opening 22a of the protective layer 22. The terminal 62x of the line 6a of the substrate 1 is supplied with a potential Va higher than potential Vb supplied to the line 6 located on one side of the line 6a of the substrate 1 through the line 9a of the FPC 7x. For example, the line 6a including the terminal 62x can be considered as a source voltage line supplied with a plus high potential.

In the mounting structure 74 according to the fifth embodiment having the above-mentioned configuration, the terminal portion 62a of the two terminal portions 62a and 62b of the line 6a is covered with the corrosion-resistance conductive film 80. Accordingly, when the mounting structure 74 is used, for example, under a high-temperature and high-humidity environment, a high potential (for example, 6 V) Va is applied to the line 6a, and a potential (for example, a reference potential of 0 V) Vb lower than that of the line 6a is applied to the line 6 located on one side of the line 6a, a great potential difference exists between the line 6a and the line 6 located on one side thereof. Accordingly, one terminal portion 62b of the two terminal portions 62a and 62b of the line 6a may be corroded and broken by the electrochemical reaction.

However, since an equivalent potential is applied to the terminal portions 62a and 62b of the line 6a, one terminal portion 62a of the line 6a has a potential difference of about 0 V from the other terminal portion 62b. As a result, the electrochemical reaction hardly occurs and the terminal portion 62b of the line 6a, the terminal 92x of the line 9a, and the corrosion-resistance conductive film 80 serve as a barrier, whereby it is possible to prevent at least one terminal portion not adjacent to the other terminals from corrosion and break.

Since the terminal 92x of the line 9a is formed of a metal film and the surface of the metal film is plated with gold or the like having corrosion resistance, the terminal 92x of the line 9a is hardly corroded and broken.

According to this embodiment, since the terminal portion 62a of the first terminal is covered with the corrosion-resistance conductive film 80 unlike the fourth embodiment, the electrochemical reaction further hardly occurs in the terminal portion 62a of the line 6a and thus the terminal 62x of the line 6a can be prevented from the corrosion and break.

As a result, it is possible to improve the reliability in electrical connection between the first terminal and the second terminal of the mounting structure 74. According to this configuration, the layout of the lines 6 and 9 is not complicated and the increase in cost due to the layout of the lines 6 and 9 is not caused, compared with the configurations described in JP-A-2001-332820 and JP-A-11-142871.

Sixth Embodiment

A configuration of a mounting structure 75 according to a sixth embodiment of the invention will be described now with reference to FIGS. 8A and 8B.

Figure 8A:
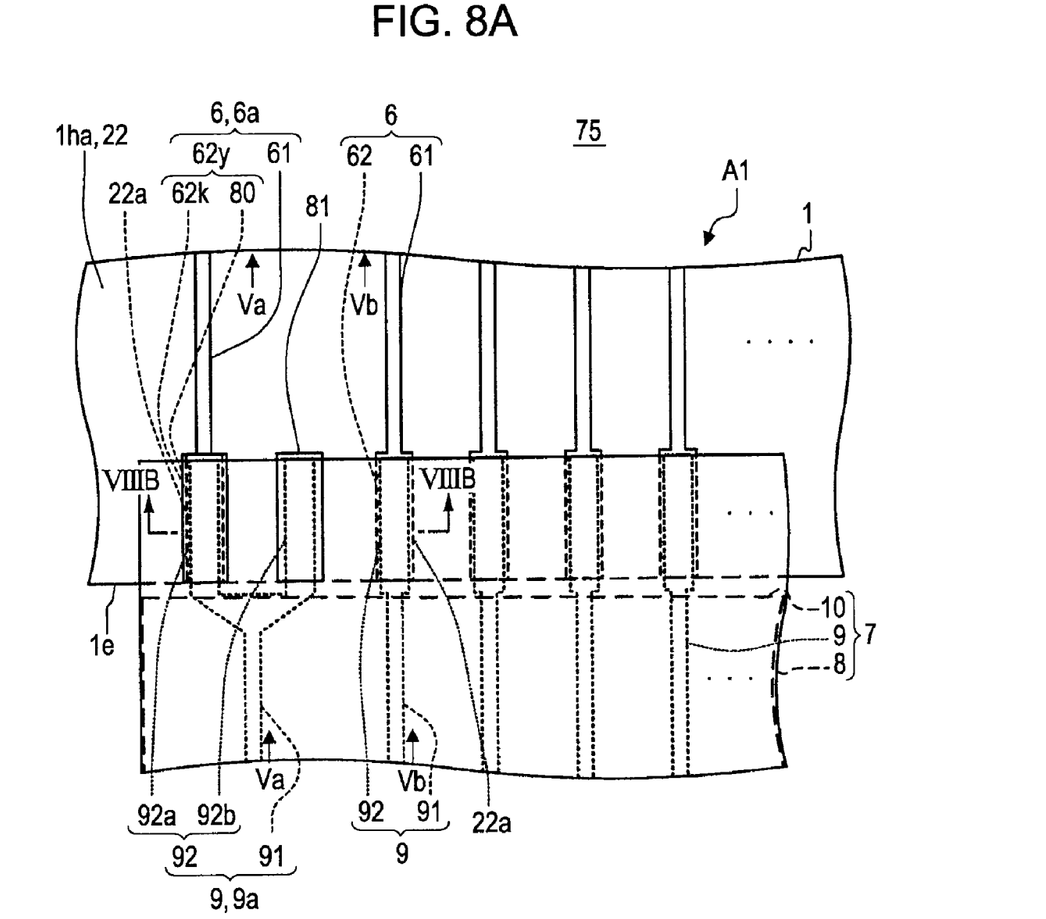
FIGS. 8A and 8B are a partial plan view and a partial sectional view illustrating a mounting structure according to a sixth embodiment of the invention, respectively.
Figure 8B:
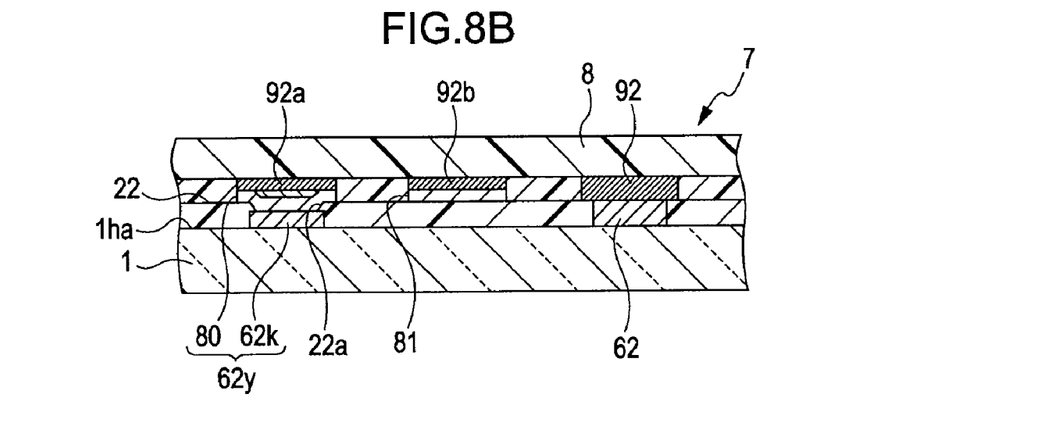

FIG. 8A is a partially enlarged plan view of the mounting structure 75 according to the sixth embodiment, which corresponds to FIG. 6A. FIG. 8B is a partial sectional view of the mounting structure 75 taken along line VIIIB-VIIIB of FIG. 8A.

The sixth embodiment and the fourth embodiment are different from each other in the terminal structure corresponding to the terminal 62 of the line 6a in the substrate 1 and both are equal to each other in the other configuration. Accordingly, like reference numerals are given to elements like those of the fourth embodiment and description thereof is properly omitted.

Specifically, paying attention to a terminal 62y of one line 6a of plural external connection lines 6 in the substrate 1 of the mounting structure 75, the terminal 62y of the line 6a is formed as a first terminal including one terminal portion 62k formed of a metal film and a corrosion-resistance conductive film (for example, a transparent conductive film of ITO or the like) 80. The conductive film 80 is disposed at a position covering the terminal portion 62k and at a position overlapping with the terminal portion 62k in a plan view. In the mounting structure 75, a corrosion-resistance island-shaped conductive film (for example, transparent conductive films of ITO or the like) 81 is disposed on one side of the terminal 62y on the substrate 1. On the other hand, the configuration of the FPC 7 of the mounting structure 75 is equal to that of the fourth embodiment and a terminal 92 of one line 9a of plural lines 9 is formed as a second terminal including two terminal portions 92a and 92b. The conductive film 80 covering the terminal 62y of the line 6a is electrically connected to the terminal portion 62k through an opening 22a of the protective layer 22 and is electrically connected to the terminal portion 92a of the line 9a in the FPC 7. The conductive film 81 is electrically connected to the terminal portion 92b of the line 9a in the FPC 7.

In this configuration, the terminal 62y of the line 6a of the substrate 1 is supplied with a potential Va higher than a potential Vb supplied to the line 6 located on one side of the line 6a through the line 9a of the FPC 7. For example, the line 6a including the terminal 62y can be considered as a source voltage line supplied with a plus high potential.

In the mounting structure 75 according to the sixth embodiment, the following advantages can be obtained.

That is, in the mounting structure 75, the terminal 62y of the line 6a includes one terminal portion 62k formed of a metal film and the corrosion-resistance conductive film 80 covering the terminal portion 62k. The corrosion-resistance island-shaped conductive film 81 is disposed on one side of the terminal 62y of the line 6a. Accordingly, when the liquid crystal device having the mounting structure 75 is used, for example, under a high-temperature and high-humidity environment, a high potential (for example, 6 V) Va is applied to the lines 6a and 9a, and a low potential (for example, a reference potential of 0 V) Vb is applied to the line 6 located on one side of the line 6a, a great potential difference exists between the line 6a and the line 6 located on one side thereof. Accordingly, the conductive film 81 located on one side of the terminal 62y of the line 6a may be corroded and broken by the electrochemical reaction.

However, since an equivalent potential is applied to the terminal 62y of the line 6a and the corrosion-resistance island-shaped conductive film 81 located on one side of the terminal 62y, the terminal 62y of the line 6a has a potential difference of about 0 V from the corrosion-resistance island-shaped conductive film 81 located on one side of the terminal 62y. As a result, the electrochemical reaction hardly occurs and the corrosion-resistance conductive film 80 constituting the terminal 62y of the line 6a, the corrosion-resistance island-shaped conductive film 81 on one side thereof, and two terminal portions 92a and 92b of the line 9a serve as a barrier, whereby it is possible to prevent the terminal portion 62k of the line 6a from corrosion and break. Since the terminal 92 of the line 9a is formed of a metal film and the surface of the metal film is plated with gold or the like having corrosion resistance, the terminal 92 of the line 9a is hardly corroded and broken.

According to this embodiment, the terminal portion 62k of the first terminal is covered with the corrosion-resistance conductive film 80 unlike the fourth embodiment. In addition, since the pair of corrosion-resistance island-shaped conductive film 81 is disposed on one side of the terminal 62y of the line 6a, the electrochemical reaction further hardly occurs in the terminal portion 62k of the line 6a and thus the terminal 62y of the line 6a can be prevented from the corrosion and break.

As a result, it is possible to improve the reliability in electrical connection between the first terminal of the substrate 1 in the mounting structure 75 and the corrosion-resistance island-shaped conductive films 81 located on one side thereof and the second terminal of the substrate 2. According to this configuration, the layout of the lines 6 and 9 is not complicated and the increase in cost due to the layout of the lines 6 and 9 is not caused, compared with the configurations described in JP-A-2001-332820 and JP-A-11-142871.

In this embodiment, the configuration of the terminal 92 of the line 9a is not limited to two terminal portions, but may include three or more terminal portions. In this configuration, only two terminal portions of the three or more terminal portions of the line 9a may be electrically connected to the terminal 62y of the line 6a and the conductive film 81 located on one side of the terminal 62y.

Modified Example

The embodiments may be modified in various forms without departing from the gist of the invention.

For example, the number of lines 6a having the terminal structure according to the first to sixth embodiments is not limited, but the number of lines having the terminal structure according to the first to sixth embodiments may be disposed to correspond to the number of lines having a high potentials.

The plural terminal portions of the first terminal of the substrate 1 according to the first, second, fourth, and fifth embodiments may be changed in width. In this configuration, when the terminal portion not adjacent to other terminals formed in the first substrate is excessively reduced in width, the resistance may increase to cause a problem. Accordingly, it is preferable that the width is not excessively reduced.

In the third and sixth embodiments, the terminal portions of the first terminal of the substrate 1 and the corrosion-resistance island-shaped conductive film disposed adjacent to the first terminal may be changed in width. In this case, when the terminal portions not adjacent to other terminals formed in the first substrate are excessively reduced in width, the resistance may increase to cause a problem. Accordingly, it is preferable that the width is not excessively reduced.

The line 6a having the terminal structure according to the first to sixth embodiments can be applied to the lines 9 of the FPC 7 and 7x, in addition to the substrate 1.

The substrate to which the mounting structure having the terminal structure according to the first to sixth embodiments can be applied is not limited to the substrate (first substrate) 1 or the FPC (second substrate) 7 or 7x for the liquid crystal device 100 as an example of an electro-optical device, but the first substrate and the second substrate may be various substrates other than the electro-optical device or the FPC. For example, the second substrate may be a driver IC.

Electronic Apparatus

Specific examples of an electronic apparatus having the liquid crystal device (hereinafter, referred to as "liquid crystal device 1000 according to the embodiment) having one mounting structure according to any of the first to sixth embodiment and the modified examples will be described with reference to FIG. 10.

Figure 9A:
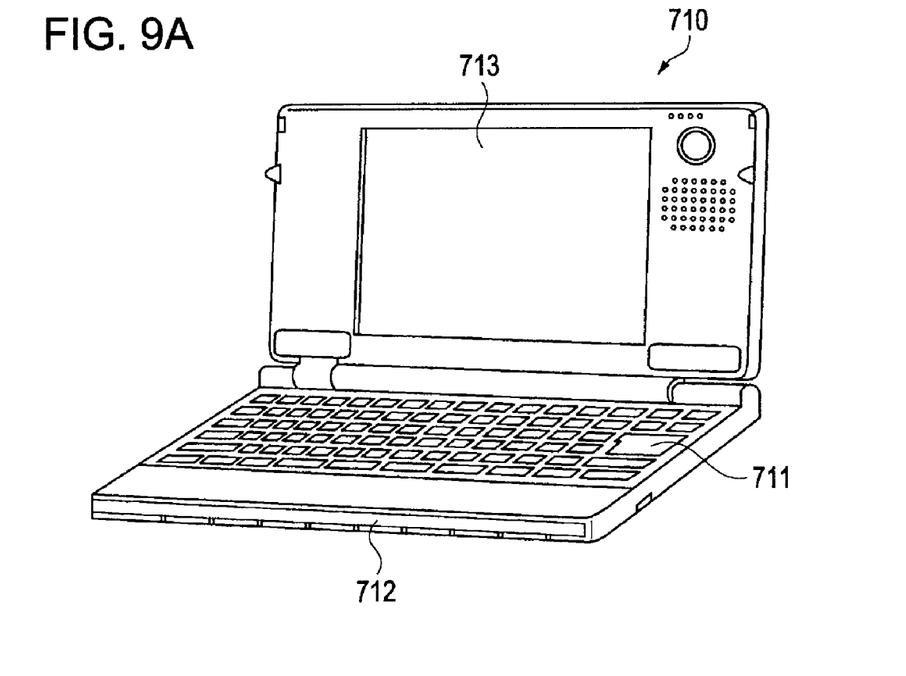
FIGS. 9A and 9B are perspective views of electronic apparatuses having the liquid crystal device according to the embodiments of the invention.

First, an example where the liquid crystal device 1000 according to the embodiment is applied as a display unit of a portable personal computer (so-called notebook computer) will be described now. FIG. 9A is a perspective view illustrating a configuration of the personal computer. As shown in the drawing, the personal computer 710 includes a main body 712 having a keyboard 711 and a display unit 713 employing the liquid crystal device 1000 according to the embodiment.

Figure 9B:
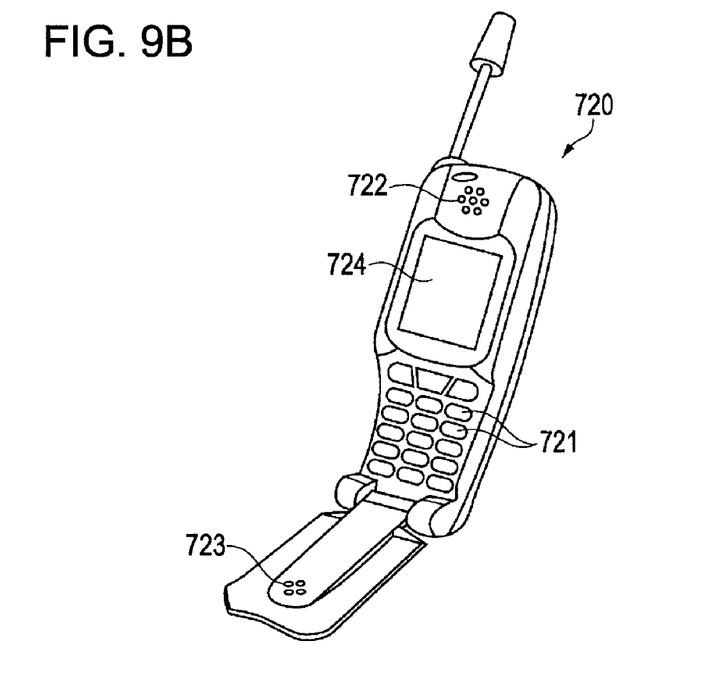

An example where the liquid crystal device 1000 according to the embodiment is applied as a display unit of a mobile phone will be described now. FIG. 9B is a perspective view illustrating a configuration of the mobile phone. As shown in the drawing, the mobile phone 720 includes an earpiece 722, a mouthpiece 723, and a display unit 724 employing the liquid crystal device 1000 according to the embodiment, in addition to plural operation buttons 721.

Examples of the electronic apparatus employing the liquid crystal device 1000 according to the embodiment can include a liquid crystal TV, a view finder type or monitor direct viewing type video tape recorder, a car navigation apparatus, a pager, an electronic pocketbook, an electronic calculator, a word processor, a work station, a television phone, a POS terminal, and a digital still camera, in addition to the personal computer shown in FIG. 9A and the mobile phone shown in FIG. 9B.

The entire disclosure of Japanese Patent Application Nos: 2008-075298, field Mar. 24, 2008 and 2009-027453, field Feb. 9, 2009 are expressly incorporated by reference herein.

What is claimed is:

1. A mounting structure comprising: a first substrate; a second substrate; a first terminal being formed on the first substrate and having a plurality of terminal portions arranged with a gap therebetween; a different terminal being formed on the first substrate and being adjacent to the first terminal; and a second terminal being formed on the second substrate and being electrically connected to at least one of the terminal portions of the first terminal, wherein the first terminal is supplied with a potential higher than that supplied to the different terminal; and wherein the terminal portions of the first terminal include at least three terminal portions, wherein the second terminal includes at least three terminal portions arranged with a gap therebetween, and wherein the at least three terminal portions of the first terminal are electrically connected to the at least three terminal portions of the second terminal.

2. The mounting structure according to claim 1, wherein the second terminal of the second substrate has a plurality of terminal portions arranged with a gap therebetween, and wherein the terminal portions of the second terminal are electrically connected to the terminal portions of the first terminal.

3. The mounting structure according to claim 1, wherein the different terminal is formed on only one side of the first terminal on the first substrate.

4. An electro-optical device comprising the mounting structure according to claim 1.

5. An electronic apparatus comprising the electro-optical device according to claim 4 as a display unit.

* * * * *